(12) United States Patent
Mirkin et al.

(10) Patent No.: US 8,012,400 B2
(45) Date of Patent: Sep. 6, 2011

(54) SURFACE AND SITE-SPECIFIC POLYMERIZATION BY DIRECT-WRITE LITHOGRAPHY

(75) Inventors: Chad A. Mirkin, Wilmette, IL (US);
Xiaogang Liu, Evanston, IL (US);
Shouwu Guo, Minneapolis, MN (US)

(73) Assignee: Northwestern University, Evanston, IL (US)

( * ) Notice: Subject to any disclaimer, the term of this patent is extended or adjusted under 35 U.S.C. 154(b) by 720 days.

(21) Appl. No.: 11/966,764

(22) Filed: Dec. 28, 2007

(65) Prior Publication Data

US 2008/0167202 A1  Jul. 10, 2008

Related U.S. Application Data

(63) Continuation of application No. 10/893,543, filed on Jul. 19, 2004, now Pat. No. 7,326,380.

(60) Provisional application No. 60/488,094, filed on Jul. 18, 2003.

(51) Int. Cl.
*B29C 35/08* (2006.01)

(52) U.S. Cl. ........ 264/494; 264/104; 264/105; 264/236; 264/293; 264/310; 347/20

(58) Field of Classification Search .................. 264/494, 264/236, 104, 105, 293, 310; 347/20
See application file for complete search history.

(56) References Cited

U.S. PATENT DOCUMENTS

| | | | |
|---|---|---|---|
| 4,607,112 A | 8/1986 | Grubbs et al. |
| 4,645,814 A | 2/1987 | Grubbs et al. |
| 4,690,992 A | 9/1987 | Grubbs et al. |
| 4,883,851 A | 11/1989 | Grubbs et al. |
| 4,945,135 A | 7/1990 | Grubbs et al. |
| 4,945,141 A | 7/1990 | Grubbs et al. |
| 4,945,144 A | 7/1990 | Grubbs et al. |
| 5,026,783 A | 6/1991 | Grubbs et al. |
| 5,312,940 A | 5/1994 | Grubbs et al. |
| 5,342,909 A | 8/1994 | Grubbs et al. |

(Continued)

FOREIGN PATENT DOCUMENTS

GB  1 399 895 A  7/1975

(Continued)

OTHER PUBLICATIONS

Agarwal, G., et al., "Immobilization of Histidine-Tagged Proteins on Nickel by Electrochemical Dip Pen Nanolithography", *J. Am. Chem. Soc.*, vol. 125, pp. 7408-7412 (2003).

(Continued)

*Primary Examiner* — Peter D. Mulcahy
*Assistant Examiner* — Henry Hu
(74) *Attorney, Agent, or Firm* — Foley & Lardner LLP

(57) ABSTRACT

Polymeric microstructures and nanostructures can be prepared with use of a tip to pattern a surface. A tip can be used to pattern a structure which can initiate polymerization. The structure can be then exposed to monomer to induce polymerization at the structure. Alternatively, a tip can be used to pattern a surface with a monomer in which the surface is treated with polymerization catalyst so that polymerization occurs at the patterning site. Ring-opening metathesis polymerization can be carried out with use of the tip to control the polymerization. The tip can be a sharp tip as used in for example an atomic force microscope tip. Norbornene types of monomers can be used. Biological macromolecules can be also prepared.

12 Claims, 6 Drawing Sheets

U.S. PATENT DOCUMENTS

| | | | |
|---|---|---|---|
| 5,710,298 | A | 1/1998 | Grubbs et al. |
| 5,728,785 | A | 3/1998 | Grubbs et al. |
| 5,728,917 | A | 3/1998 | Grubbs et al. |
| 5,750,815 | A | 5/1998 | Grubbs et al. |
| 5,811,515 | A | 9/1998 | Grubbs et al. |
| 5,831,108 | A | 11/1998 | Grubbs et al. |
| 5,849,851 | A | 12/1998 | Grubbs et al. |
| 5,880,231 | A | 3/1999 | Grubbs et al. |
| 5,916,983 | A | 6/1999 | Pederson |
| 5,917,071 | A | 6/1999 | Grubbs et al. |
| 5,922,863 | A | 7/1999 | Grubbs et al. |
| 5,939,504 | A | 8/1999 | Woodson, Jr. |
| 5,969,170 | A | 10/1999 | Grubbs et al. |
| 5,977,393 | A | 11/1999 | Grubbs et al. |
| 6,020,443 | A | 2/2000 | Woodson |
| 6,048,993 | A | 4/2000 | Grubbs et al. |
| 6,080,826 | A | 6/2000 | Grubbs et al. |
| 6,099,807 | A | 8/2000 | Leung |
| 6,107,420 | A | 8/2000 | Grubbs et al. |
| 6,111,121 | A | 8/2000 | Grubbs et al. |
| 6,153,714 | A | 11/2000 | Bansleben et al. |
| 6,153,778 | A | 11/2000 | Grubbs et al. |
| 6,203,923 | B1 | 3/2001 | Bansleben |
| 6,211,391 | B1 | 4/2001 | Grubbs et al. |
| 6,215,019 | B1 | 4/2001 | Pederson et al. |
| 6,284,852 | B1 | 9/2001 | Lynn et al. |
| 6,306,988 | B1 | 10/2001 | Grubbs et al. |
| 6,310,121 | B1 | 10/2001 | Woodson, Jr. et al. |
| 6,313,332 | B1 | 11/2001 | Grubbs et al. |
| 6,376,690 | B1 | 4/2002 | Grubbs et al. |
| 6,383,319 | B1 | 5/2002 | Humble et al. |
| 6,406,844 | B1 | 6/2002 | Pirrung et al. |
| 6,410,666 | B1 | 6/2002 | Grubbs et al. |
| 6,414,097 | B1 | 7/2002 | Grubbs et al. |
| 6,420,169 | B1 | 7/2002 | Read et al. |
| 6,426,419 | B1 | 7/2002 | Grubbs et al. |
| 6,433,101 | B1 | 8/2002 | Woodson |
| 6,465,590 | B1 | 8/2002 | Adams |
| 6,482,908 | B1 | 11/2002 | Grubbs et al. |
| 6,486,279 | B2 | 11/2002 | Lynn et al. |
| 6,504,041 | B2 | 1/2003 | Grubbs et al. |
| 6,506,860 | B1 | 1/2003 | Bansleben et al. |
| 6,515,084 | B2 | 2/2003 | Grubbs et al. |
| 6,566,495 | B1 | 5/2003 | Fodor et al. |
| 6,951,380 | B2 * | 10/2005 | Kubota et al. ............ 347/20 |
| 7,108,953 | B2 * | 9/2006 | Berger et al. ........... 430/270.1 |
| 2002/0063212 | A1 | 5/2002 | Mirkin et al. |
| 2002/0071943 | A1 | 6/2002 | Hawker et al. |
| 2002/0102564 | A1 | 8/2002 | Mittmann et al. |
| 2002/0122873 | A1 | 9/2002 | Mirkin et al. |
| 2002/0123135 | A1 | 9/2002 | Henderson et al. |
| 2003/0005755 | A1 | 1/2003 | Schwartz |
| 2003/0007242 | A1 | 1/2003 | Schwartz |
| 2003/0022470 | A1 | 1/2003 | Liu et al. |
| 2003/0062638 | A1 * | 4/2003 | Dhar ..................... 264/1.31 |
| 2003/0068446 | A1 | 4/2003 | Mirkin et al. |
| 2005/0255237 | A1 * | 11/2005 | Zhang et al. ............ 427/180 |

FOREIGN PATENT DOCUMENTS

| | | | |
|---|---|---|---|
| WO | WO 00/00319 | A1 | 1/2000 |
| WO | WO 00/41213 | A1 | 7/2000 |
| WO | WO 01/91855 | A1 | 12/2001 |
| WO | WO 03/001633 | | 1/2003 |
| WO | WO-2005/048283 | A2 * | 5/2005 |

OTHER PUBLICATIONS

Allcock, H. R., et al., "*Contemporary Polymer Chemistry*", Prentice Hall, including Chapter 8, pp. 166-197, (1981).

Barrett, A. G. M., et al., "ROMPgel Reagents in Parallel Synthesis", *Chem. Rev*, vol. 102, pp. 3301-3324 (2002).

Belaubre, P. P., et al., "Fabrication of biological microarrays using microcantilevers", *Appl. Phys. Lett*, vol. 82, No. 18, pp. 3122-3124 (2003).

Brandow, S. L., et al., "Nanolithography by displacement of catalytic metal clusters using an atomic force microscope tip", *J. Vac. Sci. Technol. B*, vol. 15, No. 5, pp. 1818-1824 (1997).

Buchmeiser, M. R., et al., "ROMP-Based, Highly Hydrophilic Poly(7-oxanorborn-2-ene-5,6-dicqarboxylic acid)-Coated Silica for Analytical and Preparative Scale High-Performance Ion Chromatography", *Chem. Mater*, vol. 11, pp. 1533-1540 (1999).

Cheung, C. L., et al., "Fabrication of Assembled Virus Nanostrucutres on Templates of Chemoselective Linkers Formed by Scanning Probe Nanolithography", *J. Am. Chem. Soc.*, vol. 125, No. 23, pp. 6848-6849 (2003).

Clark, S. L., et al., "Engineering the Microfabrication of Layer-by-Layer Thin Films", *Adv. Mater*, vol. 10, No. 18, pp. 1515-1519 (1998).

Demers, L. M., et al., "Direct Patterning of Modified Oligonucleotides on Metals and Insulators by Dip-Pen Nanolithography", *Science*, vol. 296, pp. 1836-1838 (Jun. 7, 2002).

Domercq, B., et al., "Photo-Patternable Hole-Transport Polymers for Organic Light-Emitting Diodes", *Chem. Mater.*, vol. 15, No. 7, pp. 1491-1496 (2003).

Frechet, J.M.J., et al., "Poly($p$-tert-butoxycarbonyloxystyreme): a convenient precursor to $p$hydroxystyrene resins", *Polymer*, vol. 24, pp. 995-1000 (Aug. 1983).

Gibson, G., et al., "*A Primer of Genome Science*", Sinauer Associates, 2002.

Husemann, M., et al., "Surface-Initiated Polymerization for Amplification of Self-Assembled Mono-layers Patterned by Microcontact Printing", *Agnew. Chem. Int. Ed*. vol. 38, No. 5, pp. 647-649 (1999).

Jang, C-H., et al., "Immobilized Enzymes as Catalytically-Active Tools for Nanofabrication", *J. Am. Chem. Soc.*, vol. 124, pp. 12114-12115 (2002).

Jones, D.M., et al., "Controlled Surface-Initiated Polymerizations in Aqueous Media", *Adv. Mater.*, vol. 13, No. 16, pp. 1256-1259 (2001).

Khosravi, E., et al., "*Ring Opening Metathesis Polymerisation and Related Chemistry*", NATO Science Series, vol. 56 (2002).

Kim, N. Y., et al., "Surface-Initiated Ring-Opening Metathesis Polymerization on Si/SiO$_2$", *Macromolecules*, vol. 33, No. 8, pp. 2793-2795 (2000).

Lackowski, W. M., et al., "Micron-Scale Patterning of Hyperbranched Polymer Films by Micro-Contact Printing", *J. Am. Chem. Soc.*, vol. 121, pp. 1419-1420 (1999).

Li, Y., et al., "Electrochemical AFM 'Dip-Pen' Nanolithography", *J. Am. Chem. Soc.*, vol. 123, pp. 2105-2106 (2001).

Liu, G.-Y., et al., "Nanofabrication of Self-Assembled Monolayers Using Scanning Probe Lithography", *Acc. Chem. Res.*, vol. 33, No. 7, pp. 457-466 (2000).

Lyo, I. W., et al., "Field-Induced Nanometer- to Atomic-Scale Manipulation of Silicon Surfaces with the STM", *Science*, vol. 253, pp. 173-176 (Jul. 1991).

Madou, Marc J. "*Fundamentals of Microfabrication, The Science of Miniaturization*", 2$^{nd}$ Ed., CRC Press, including Chapters 1-3, 2002.

Manandhar, P. P., et al., "Anomalous Surface Diffusion in Nanoscale Direct Deposition Processes", *Phys. Rev. Lett.*, vol. 90, No. 11, pp. 115505-1-115505-4 (2003).

Maoz, R., et al., "Constructive Nanolithography: Site-Defined Silver Self-Assembly on Nanoelectrochemically Patterned Monolayer Templates", *Adv. Mater.*, vol. 12, No. 6, pp. 424-429 (2000).

Maynor, B. W., et al., "Au 'Ink' for AFM 'Dip-Pen' Nanolithography", *Langmuir*, vol. 17, No. 9, pp. 2575-2578 (2001).

McKendry, R., et al., "Creating Nanoscale Patterns of Dendrimers on Silicon Surfaces Dip-Pen Nanolithography", *Nano Lett.*, vol. 2, No. 7, pp. 713-716 (2002).

Noy, A., et al., "Fabrication of Luminescent Nanostructures and Polymer Nanowires Using Dip-Pen Nanolithography", *Nano Lett.*, vol. 2, No. 2, pp. 109-112 (2002).

PCT/US04/23223, filed Jul. 12, 2004, Intl. Search Report dated Aug. 14, 2006.

A. Pique, et al., "*Direct-Write Technologies for Rapid Prototyping Applications, Sensors, Electronics, and Integrated Power Sources*", Academic Press, (2002).

Pogantsch, A., et al., "Multicolor Organic Electroluminescent Devices Fabricated by a Reductive Photo-patterning Method", *Adv. Mater.*, vol. 14, No. 23, pp. 1722-1725 (Dec. 2002).

Porter, L. A., Jr., et al., "Electroless Nanoparticle Film Deposition Compatible with Photolithography Microcontact Printing, and Dip-Pen Nanolithography Patterning Technologies", *Nano Lett*, vol. 2, No. 12, pp. 1369-1372 (2002).

Posner, G. H., et al., "A Mechanistic and Synthetic Study of Organocopper Substitution Reactions with some Homoallylic and Cyclopropylcarbinyl Substrates", *Tetrahedron*, vol. 32, pp. 2281-2287 (1976).

Prucker, O, et al., "Synthesis of Poly(styrene) Monolayers Attached to High Surface Area Silica Gels through Self-Assembled Monolayers of Azo Initiators", *Macromolecules*, vol. 31, No. 3, pp. 592-601 (1998).

Rowan, B., et al., "Patterning Bacteria within Hyperbranched Polymer Film Templates", *Langmuir*, vol. 18, No. 25, pp. 9914-9917 (2002).

Rule, J. D., et al., "ROMP Reactivity of endo- and exo-Dicyclopentadiene", *Macromolecules*, vol. 35, No. 21, pp. 7878-7882 (2002).

Schmelmer, U., et al., "Surface-Initiated Polymerization on Self-Assembled Monolayers: Amplification of Patterns on the Micrometer and Nanometer Scale", *Angew. Chem. Int. Ed.*, vol. 42, No. 5, pp. 559-563 (2003).

Sheehan, P. E., et al., "Thiol Diffusion and the Role of Humidity in 'Dip Pen nanolithography'", *Phys. Rev. Lett.*, vol. 88, No. 15, pp. 156104-1-156104-4 (2002).

Sugimura, H., et al., "Nanoscale patterning of an organosilane monolayer on the basis of ti-p-induced electrochemistry in atomic force microscopy", *J. Vac. Sci. Technol. B*, vol. 14, No. 6, pp. 4140-4143 (Nov./Dec. 1996).

Trnka, T. M., et al., "The Development of $L_2X_2Ru=CHR$ Olefin Metathesis Catalysts: An Organometallic Success Story", *Acc. Chem. Res.*, vol. 34, No. 1, pp. 18-29 (2001).

Von Werne, T. A., et al., "A Versatile Method for Tuning the Chemistry and Size of Nanoscopic Features by Living Free Radical Polymerization", *J. Am. Chem. Soc.*, vol. 125, No. 13, pp. 3831-3838 (2003).

Watson, K. J., et al., "Hybrid Nanoparticles with Block Copolymer Shell Structures", *J. Am. Chem. Soc.*, vol. 121, pp. 462-463 (1999).

Weck, M., et al., "Ring-Opening Mateathesis Polymerization from Surfaces", *J. Am. Chem. Soc.*, vol. 121, pp. 4088-4089 (1999).

Xu, Y., et al., "Patterned Monolayer/Polymer Films for Analysis of Dilute or Salt-Contaminated Protein Samples by MALDI-MS", *Anal. Chem.*, vol. 75, No. 2, pp. 185-190 (2003).

Zhang, H., et al., "Fabrication of Sub-50-nm Solid-State Nanostrucutres on the Basis of Dip-Pen Nanolithography", *Nano Lett.*, vol. 3, No. 1, pp. 43-45 (2003).

Zhang, M., et al., "A MEMS nanoplotter with high-density parallel dip-pen nanolithography probe arrays", Nanotech, vol. 13, pp. 212-217 (2002).

Supplemental European Search Report in Related Application No. EP 04 81 6778 mailed Nov. 3, 2010.

Jeon, N. et al, "Patterned polymer growth on silicon surfaces using microcontact printing and surface-initiated polymerization," 75 Applied Physics Letters 4201 (Dec. 27, 1999).

\* cited by examiner

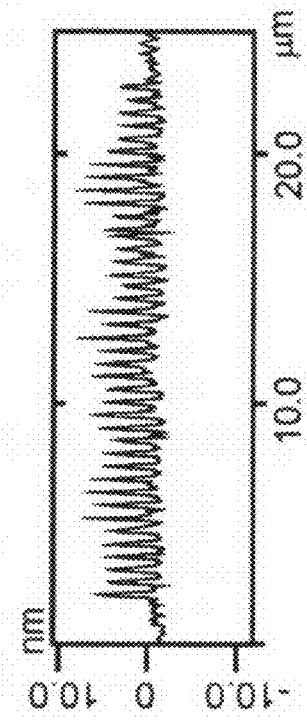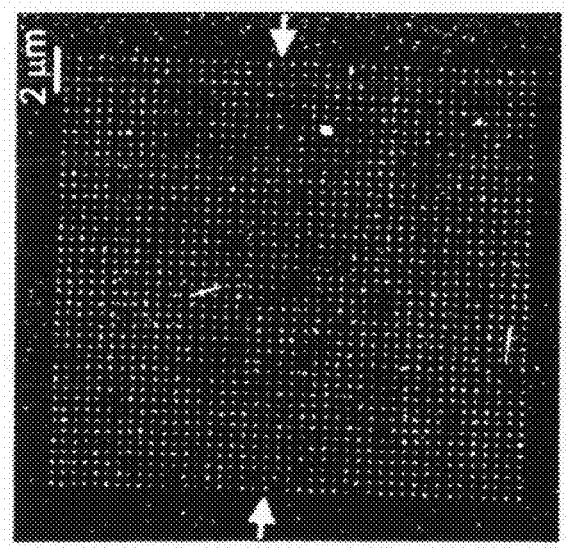
Figure 1A
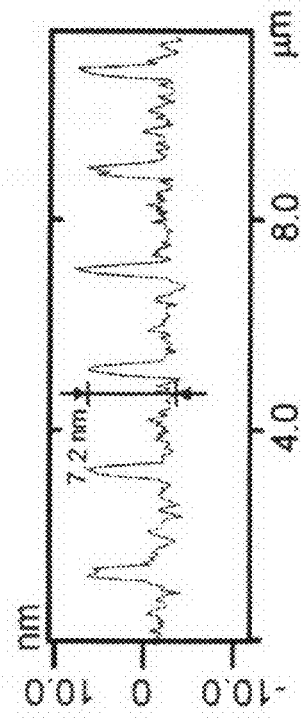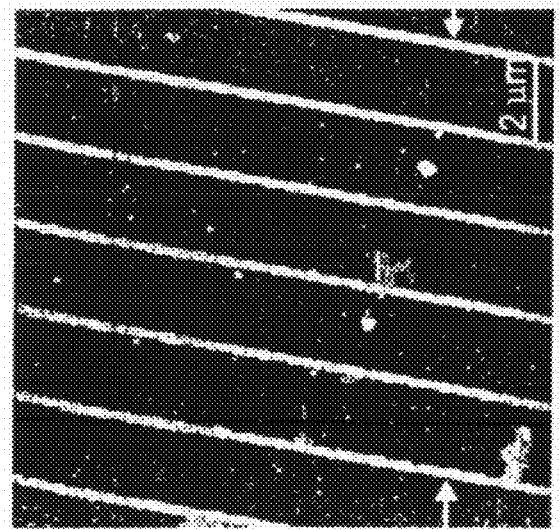
Figure 1C
Figure 1B
Figure 1D

SURFACE AND SITE-SPECIFIC POLYMERIZATION BY DIRECT-WRITE LITHOGRAPHY

CROSS-REFERENCE TO RELATED APPLICATIONS

This application claims priority to U.S. application Ser. No. 10/893,543 to Mirkin et al. filed Jul. 19, 2004, which claims priority to U.S. provisional application 60/488,094 to Mirkin et al. filed Jul. 18, 2003, and all of these priority applications are hereby incorporated by reference in their entirety.

STATEMENT OF FEDERALLY SPONSORED RESEARCH AND DEVELOPMENT

This application contains work funded by the U.S. Federal Government under AFOSR F49620-00-1-0283/001; DARPA/RMAC DAAD19-03-1-0065; and NSF EEC-0118025/011. The government has certain rights in the invention.

BACKGROUND

A technological need exists to better prepare metal, polymer, ceramic, and glassy structures at the micro and nanoscale including preparation of patterned structures at high resolution and registration. For example, patterned polymeric structures have attracted significant interest for applications in the development of, for example, sensors, catalysis, and optical devices.[1,2] Thus far, several strategies, based upon photolithography, electron beam lithography, and micro-contact printing have been developed for generating polymer arrays.[2] While useful for some applications, these methods do not generally allow one to control nanostructure composition in a site-specific manner, and therefore, do not generally allow one to fabricate complex multi-component polymer arrays over the nano- to microscopic length scales. Having the capability to generate multi-component arrays with nanoscopic features would afford one the opportunity to construct and study high-density combinatorial libraries of novel macromolecular systems. A general need exists to be able to combine high registration, high resolution patterning with microscopic and nanoscopic control of polymerization, including formation of polymer brushes. Small structures prepared at high resolution and excellent registration, and with careful control of composition, are needed. A need also exists to better control reactions which can occur when a compound is deposited from a tip to a surface, particularly when the tip is a fine, nanoscopic, sharp tip.

SUMMARY OF INVENTION

In this summary section, the invention is summarized as a prelude to the more full description of the invention in the detailed description section and the claims, but the invention is broader than the summary section. Herein, a novel approach is described based upon direct-write nanolithographic printing, including DIP PEN™ nanolithographic printing (DPN™ printing),[3] and ring-opening metathesis polymerization (ROMP),[4-6] to the fabrication of polymer brush arrays on the nanometer length scale.[7] DPN™ and DIP PEN™ nanolithography are proprietary trademarks of NanoInk, Inc. (Chicago, Ill.).

The combined approach utilizes the attributes of DPN printing and ROMP for synthesizing high-density polymer brush arrays with control over feature size (on the nanometer length scale), shape and inter-feature distance. Furthermore, the capability of directly delivering monomers via a tip, such as a standard AFM microcantilever, can allow one to generate small but diverse libraries of microscale and nanoscale polymer brushes that comprise large numbers of structurally distinct compounds by assembling many possible combinations of small building monomers containing desired active functionalities.

In one embodiment, the invention comprises a method of direct-write nanolithography comprising: a) patterning at least one first nanostructure of a polymerizable compound on a substrate; b) adding polymerization catalyst to the nanostructure of polymerizable compound to form a second nanostructure which can initiate the polymerization reaction; and c) polymerizing monomer on the second nanostructure to form a third polymeric nanostructure. The polymerizable compound can be, for example, an organic monomer, an organic ethylenically unsaturated monomer, an organic norbornene monomer, an organic monomer for ring-opening polymerization, an organic aliphatic cyclic monomer, a ROMP monomer, a sulfur-containing compound, a compound which can anchor to the substrate, a compound which can chemisorb to the substrate, a compound which can covalently bond to the substrate, or a compound which can physisorb to the substrate. The patterning can be carried out with use of a tip to transport the polymerizable compound to the substrate. In a preferred embodiment, the patterning is carried out with use of a nanoscopic tip to transport the polymerizable compound to the substrate. In a preferred embodiment, the patterning is carried out with use of a scanning probe microscopic tip to transport the polymerizable compound to the substrate. In a preferred embodiment, the patterning is carried out with use of an atomic force microscopic tip to transport the polymerizable compound to the substrate. In another embodiment, the patterning is carried out with use of a hollow tip to transport the polymerizable compound to the substrate. In another embodiment, the patterning is a patterning of a plurality of nanostructures which are separated from each other by an average edge-to-edge distance of about a micron or less. In another embodiment, the patterning is a patterning of a plurality of nanostructures which are separated from each other by an average edge-to-edge distance of about a 500 nm or less. In another embodiment, the patterning is a patterning of a plurality of nanostructures which are separated from each other by an average edge-to-edge distance of about a 100 nm or less. In a preferred embodiment, the polymerization catalyst provides for catalysis of ring-opening metathesis polymerization. In a preferred embodiment, the first nanostructure, the second nanostructure, and the third nanostructure have a lateral feature which is about one micron or less, or alternatively, about 500 nm or less, or alternatively about 100 nm or less. The patterning can provide a nanoarray. The patterning can also provide a nanostructure dot on the substrate.

In another embodiment, the invention provides a method of direct-write lithography comprising: a) patterning at least one first structure of a polymerizable compound on a substrate; b) adding polymerization catalyst to the structure of polymerizable compound to form a second structure which can initiate the polymerization reaction; and c) polymerizing monomer on the second structure to form a third polymeric structure. The first, second, and third structures can be microstructures or nanostructures. For example, they can have a lateral feature of about 10 microns or less, or about 5 microns or less, or about one micron or less.

In another embodiment, the invention provides a method of direct-write nanolithography comprising: patterning at least one nanostructure on a substrate, which can initiate a polymerization reaction. In a preferred embodiment, the patterning comprises: a) patterning at least one nanostructure of a polymerizable compound, and b) adding polymerization catalyst to the nanostructure of polymerizable compound to form the nanostructure which can initiate the polymerization reaction. Another embodiment provides polymerizing monomer on the nanostructure to form a polymeric nanostructure. Another embodiment is the polymerization reaction is a ring-opening polymerization reaction, and in particular, a ring-opening metathesis polymerization reaction. In another embodiment, the nanostructure which can initiate a polymerization reaction comprises at least one polymerizable compound which is a monomer for ring-opening metathesis polymerization. The monomer can chemisorb to the substrate, and the nanostructure can be a dot.

In another embodiment, the invention comprises a method of direct-write nanolithography comprising: a) patterning at least one monomer on a substrate surface with use of a tip to transfer the monomer to the surface, wherein the surface comprises a polymerization catalyst which induces polymerization of the monomer upon patterning. The polymerization can be, for example, a ring-opening metathesis polymerization. In a preferred embodiment, the surface comprises Grubbs' catalyst. In a preferred embodiment, the patterning is carried out with a plurality of monomers. The patterning can be carried out with different tip-substrate contact times, or it can be carried out with a constant tip-substrate contact time. The patterning can provide combinatorial polymer brush arrays. In a preferred embodiment, the patterning provides polymer nanostructures having an average height of about 50 nm or less, or alternatively, about 25 nm or less. In preferred embodiments, the tip is a nanoscopic tip, a scanning microscopic tip, a scanning nanoscopic tip, a scanning probe microscopic tip, an atomic force microscopic tip, or a hollow tip. In a preferred embodiment, the patterning provides a plurality of nanostructures which are separated from each other by an average edge-to-edge distance of about a micron or less. In a preferred embodiment, the patterning provides a plurality of nanostructures which are separated from each other by an average edge-to-edge distance of about 500 nm or less, or alternatively, about 100 nm or less.

The monomer can be an organic monomer, an organic ethylenically unsaturated monomer, an organic norbornene monomer, an organic monomer for ring-opening polymerization, an organic aliphatic cyclic monomer, or a ROMP monomer.

In addition, the invention comprises a method comprising: repeatedly transporting a patterning compound from a tip to a substrate site, wherein the patterning compound is a biological monomer or biological oligomer which can polymerize to form a biological macromolecule upon transport, whereby the biological monomer or biological oligomer polymerizes at the substrate site to form the biological macromolecule. In a preferred embodiment, the same tip is used in the repeated patterning. In another embodiment, a plurality of tips is used in the repeated patterning. In another embodiment, the biological macromolecule is a nucleic acid. In another embodiment, the biological macromolecule is a peptide. In another embodiment, the biological macromolecule is a protein. In another embodiment, the biological macromolecule is a DNA molecule. In another embodiment, the biological macromolecule is an RNA molecule. In another embodiment, the biological monomer is an amino acid. In another embodiment, the biological oligomer is an oligopeptide. In another embodiment, the biological oligomer is an oligonucleotide. In further embodiments, the tip is a nanoscopic tip a scanning probe nanoscopic tip, or an atomic force microscopic tip.

In addition the invention comprises a method comprising: repeatedly transporting one or more polymerizable biological macromolecular patterning compounds from a tip to a substrate site, wherein the compound can polymerize to form a biological macromolecule upon transport by reaction at the substrate site.

A basic and novel feature of the invention is that the patterning can be carried out by methods consisting essentially of patterning and polymerizing without complicated photoresists, stamps, and high vacuum equipment.

The present invention also provides articles and devices including arrays, microarrays, nanoarrays, and combinatorial arrays prepared by these and other methods. The present invention also provides uses for these articles including uses of the arrays, microarrays, nanoarrays, and combinatorial arrays.

BRIEF DESCRIPTION OF THE DRAWINGS

FIG. 1. Polymer brush nanostructures prepared according to the Scheme of FIG. 5:

a) Topographic AFM image of polymer brush lines. The speed of norbornenyl thiol deposition, polymerization time, and measured average full width at half maximum (FWHM) values are 0.02 mm/s, 60 min, and 480 nm, respectively;

b) Cross-sectional topography trace for a selected line from FIG. 1a;

c) Topographic AFM image of a polymer brush dot array. The norbornenyl thiol deposition and polymerization times are 1 s and 30 min, respectively;

d) Cross-sectional topography trace for a selected line from FIG. 1c.

Figure 2:
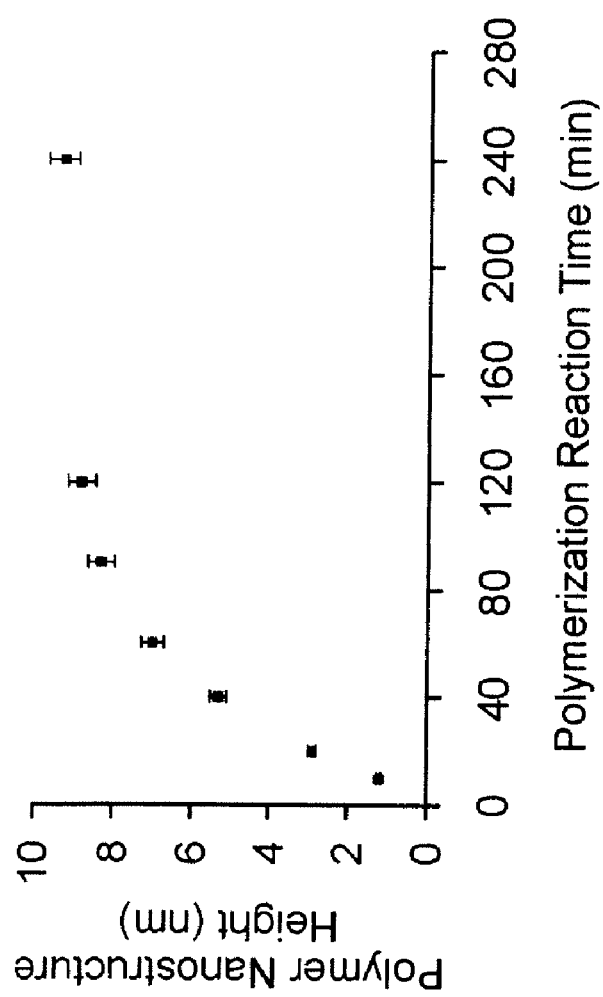

FIG. 2. The height of poly-exo-5-norbornen-2-ol brush nanostructures plotted as a function of polymerization reaction time.

Figure 3:
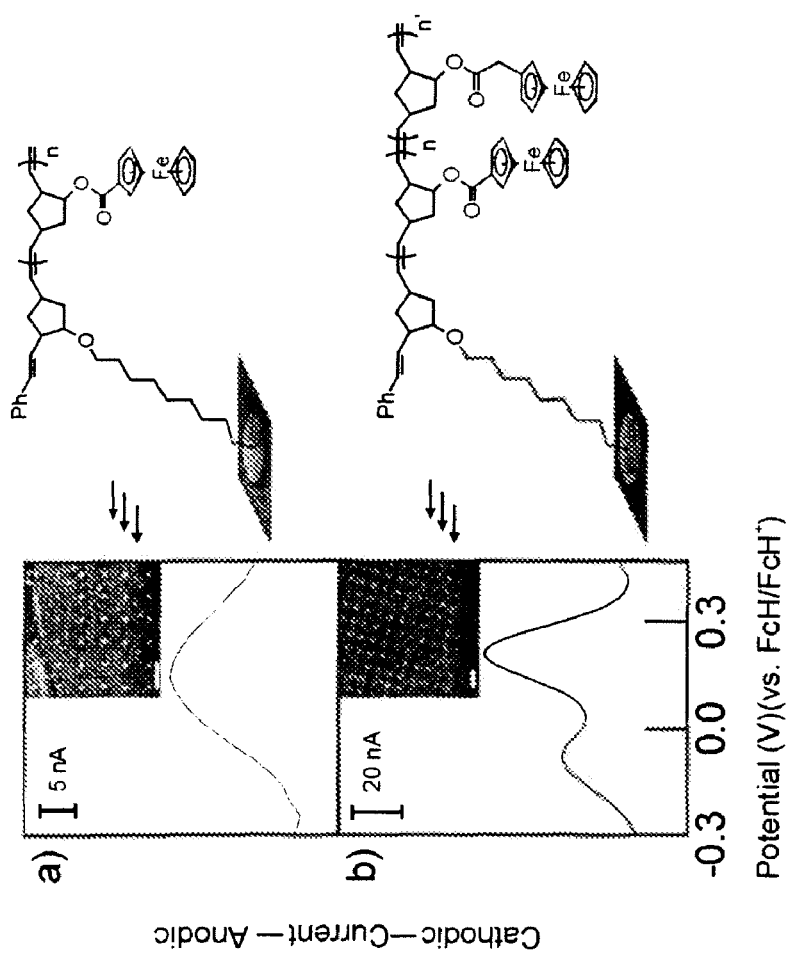

FIG. 3. a) DPV of an electrode (0.28 mm$^2$) patterned with polymer of monomer 1 via DPN printing and ROMP (Inset: AFM topography image of the poly-1 pattern. The scale bar is 2 mm);

b) DPV of an electrode patterned with diblock copolymers consisting of monomer 1 and 2 via DPN printing and ROMP (Inset: AFM topography image of the diblock copolymer brush pattern. The scale bar is 2 mm). For DPV experiments: scan rate=50 mVs$^{-1}$; pulse period=200 ms; pulse amplitude=50 mVs$^{-1}$; and pulse width=50 ms.

Figure 6:
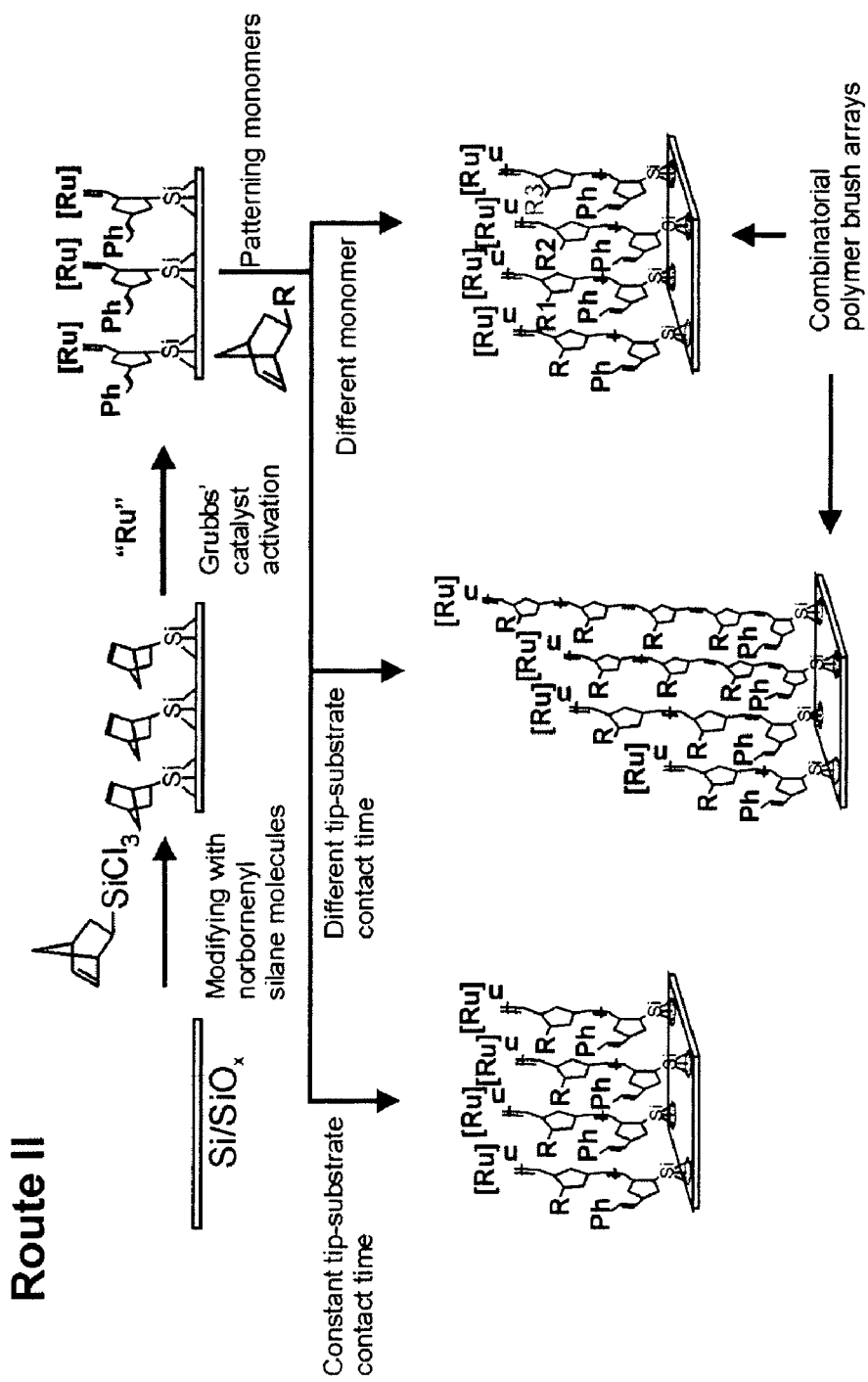

FIG. 4. a) Three-dimensional topographic AFM image of an array of polymer brush dots generated according to the method in FIG. 6 (The scale bar is 2 mm); b) A plot of nanostructure height (poly-exo-5-norbornen-2-ol) as a function of tip-induced polymerization reaction time (as measured by tip-substrate contact time). The data points are the averaged measurements, and the vertical bars correspond to the standard deviation.

Figure 5:
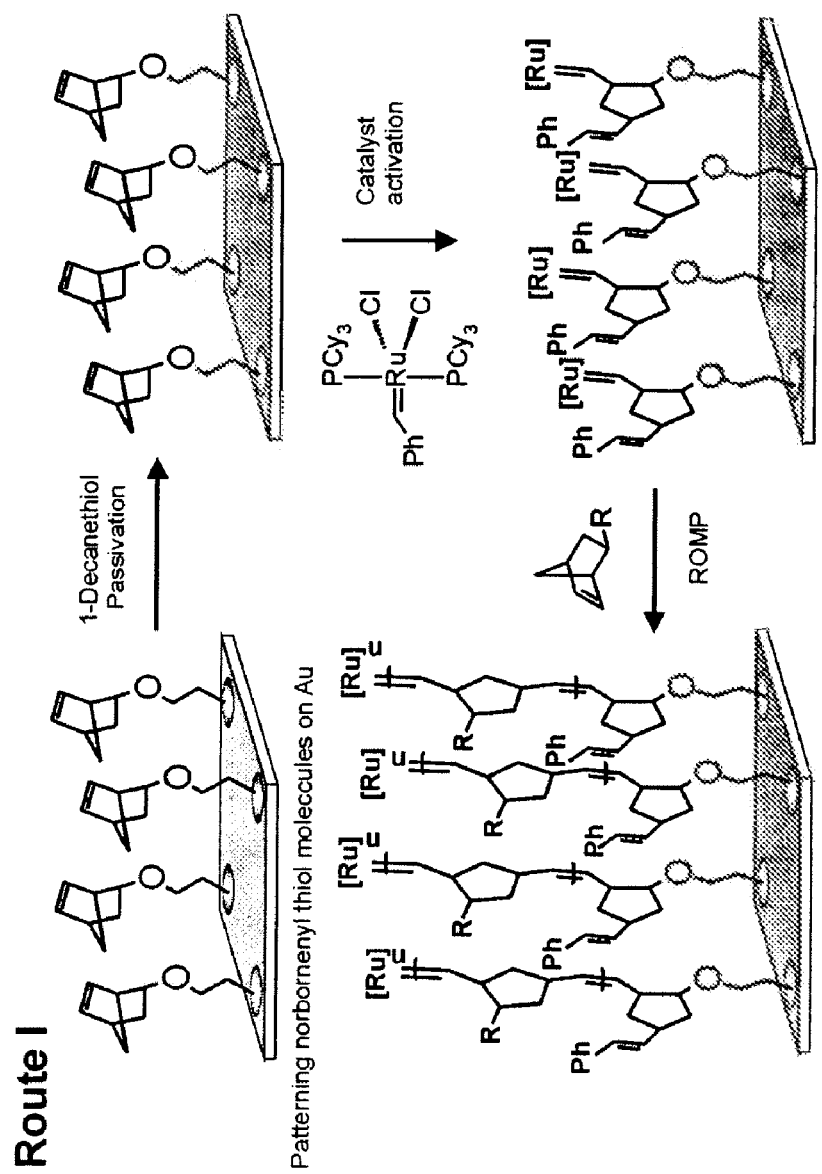

FIG. 5. Graphical representation of surface-initiated ROMP via DPN printing.

FIG. 6. Graphical representation of ROMP initiated via DPN printing and a monomer-coated tip.

DETAILED DESCRIPTION

This application claims benefit of U.S. provisional application 60/488,094 to Mirkin et al. filed Jul. 18, 2003, and this priority application is hereby incorporated by reference in its entirety including the figures, working examples, and claims.

In addition, the publication Liu, Guo, and Mirkin, "Surface and Site-Specific Ring-Opening Metathesis Polymerization Initiated by Dip-Pen Nanolithography", *Angewandte Chemie Int. Ed*, 2003, 42, 4785-4789, is hereby incorporated by reference in its entirety.

A variety of preferred embodiments can be carried out which are noted above in the summary and further described in this detailed description including the working examples below. For example, in one embodiment, the invention comprises a method of direct-write nanolithography comprising: a) patterning at least one first nanostructure of a polymerizable compound on a substrate; b) adding polymerization catalyst to the nanostructure of polymerizable compound to form a second nanostructure which can initiate the polymerization reaction; and c) polymerizing monomer on the second nanostructure to form a third polymeric nanostructure. In another preferred embodiment, the invention comprises a method of direct-write nanolithography comprising: a) patterning at least one monomer on a substrate surface with use of a tip to transfer the monomer to the surface, wherein the surface comprises a polymerization catalyst which induces polymerization of the monomer upon patterning. In addition, the invention also in another preferred embodiment comprises a method comprising: repeatedly transporting a patterning compound from a tip to a substrate site, wherein the patterning compound is a biological monomer or biological oligomer which can polymerize to form a biological macromolecule upon transport, whereby the biological monomer or biological oligomer polymerizes at the substrate site to form the biological macromolecule. In addition the invention in another preferred embodiment comprises a method comprising: repeatedly transporting one or more polymerizable biological macromolecular patterning compounds from a tip to a substrate site, wherein the compound can polymerize to form a biological macromolecule upon transport by reaction at the substrate site. The invention also comprises articles and devices prepared by these methods including patterned surfaces and arrays, including combinatorial arrangements and arrays.

By these methods, polymer brush structures can be formed wherein one end of a polymeric molecular structure is bonded to a surface and the other end is free from the surface, extending away from the surface. The polymer is surface immobilized or end immobilized, and can be anchored to the surface by, for example, covalent bonding, chemisorption, or physiosorption. Hence, a surface can be coated or surface covered with a patterned polymeric structure. This coating or surface covering can tailor the surface properties, particularly when it is patterned at a microscale or nanoscale. See, for example, *Polymer Brushes,* 2004, Wiley-VCH, (Advincula et al., Eds.); Milner, *Science,* 1991, 251, 905; Edmonsdson et al., *Chem. Soc. Rev.,* 2004, 33, 14-22; Kaholek et al., *Nanoletters,* 2004, Vol. 4, No. 2, 373-376.

When the substrate surface comprises a pattern, the regions between the patterns can be passivated as needed for further processing. For example, a pattern can be generated which is hydrophobic, and the regions between the patterns can be made hydrophilic. Alternatively, a pattern can be generated which is hydrophilic, and the regions between the patterns can be made hydrophobic. The patterned regions can comprise polymeric material whereas the regions between the patterns can be non-polymeric.

Technical literature is noted which enables one skilled in the art to practice the present invention including lithography, microlithography, nanolithography, and patterning. For example, microfabrication, microlithography, patterning, and nanolithographic methods are generally described in *Fundamentals of Microfabrication, The Science of Miniaturization,* $2^{nd}$ Ed., Marc J. Madou, CRC Press, 2002, including Chapters 1-3, which is hereby incorporated by reference in its entirety. Also, microlithography and nanolithography are generally described in *Direct-Write Technologies for Rapid Prototyping Applications, Sensors, Electronics, and Integrated Power Sources*, Ed. by A. Pique and D. Chrisey, Academic Press, 2002, which is hereby incorporated by reference in its entirety. Chapter 10, in particular, describes Dip-Pen Nanolithographic methods. Nanolithography can be carried out by a variety of methods including nanoshaving. Direct-write nanolithographic printing, including DPN printing, is described in the following documents, which are incorporated by reference in their entirety are:

1. U.S. Provisional application 60/115,133 filed Jan. 7, 1999 ("Dip Pen Nanolithography").

2. U.S. Provisional application 60/157,633 filed Oct. 4, 1999 ("Methods Utilizing Scanning Probe Microscope Tips and Products Therefor or Produced Thereby").

3. U.S. patent application Ser. No. 09/477,997 filed Jan. 5, 2000 ("Methods Utilizing Scanning Probe Microscope Tips and Products Therefor or Produced Thereby").

4. U.S. Provisional application 60/207,713 filed May 26, 2000 ("Methods Utilizing Scanning Probe Microscope Tips and Products Therefor or Produced Thereby").

5. U.S. Provisional application 60/207,711 filed May 26, 2000 ("Methods Utilizing Scanning Probe Microscope Tips and Products Therefor or Produced Thereby").

6. U.S. application Ser. No. 09/866,533 filed May 24, 2001 ("Methods Utilizing Scanning Probe Microscope Tips and Products Therefor or Produced Thereby").

7. U.S. patent publication number 2002/0063212 A1 published May 30, 2002 ("Methods Utilizing Scanning Probe Microscope Tips and Products Therefor or Produced Thereby").

8. U.S. patent publication number 2002/0122873 A1 published Sep. 5, 2002 ("Nanolithography Methods and Products Produced Therefor and Produced Thereby").

9. PCT publication number WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").

10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").

11. U.S. Provisional application 60/326,767 filed Oct. 2, 2001, ("Protein Arrays with Nanoscopic Features Generated by Dip-Pen Nanolithography").

12. U.S. Provisional application 60/337,598 filed Nov. 30, 2001, ("Patterning of Nucleic Acids by Dip-Pen Nanolithography").

13. U.S. Provisional application 60/341,614 filed Dec. 17, 2001, ("Patterning of Solid State Features by Dip-Pen Nanolithography").

14. U.S. Provisional application 60/367,514 filed Mar. 27, 2002, ("Method and Apparatus for Aligning Patterns on a Substrate").

15. U.S. Provisional application 60/379,755 filed May 14, 2002, ("Nanolithographic Calibration Methods").

16. U.S. application Ser. No. 10/261,663 filed Oct. 2, 2002, ("Protein And Peptide Nanoarrays") (see patent publication 2003/0068446).

17. U.S. application Ser. No. 10/307,515 filed Dec. 2, 2002, ("Direct Write Nanolithographic Deposition of Nucleic Acids from Nanoscopic Tips").

18 U.S. application Ser. No. 10/320,721 filed Dec. 17, 2002, ("Patterning of Solid State Features by Dip-Pen Nanolithography") (now U.S. Patent Publication 2003/0162004 published Aug. 28, 2003 to Mirkin et al).

19. U.S. application Ser. No. 10/366,717 filed Feb. 14, 2003 ("Method and Apparatus for Aligning Patterns on a Substrate").

20. U.S. application Ser. No. 10/375,060 filed Feb. 28, 2003 ("Nanolithographic Calibration Methods").

21. U.S. Patent Publication 2004/0008330, published Jan. 15, 2004 to Mirkin et al., including patterning of electrically conductive polymers.

In application Ser. No. 09/866,533, filed May 24, 2001, (see references 6 and 7 above) DIP PEN™ nanolithographic printing background and procedures are described in detail covering a wide variety of embodiments including, for example:

background (pages 1-3);
summary (pages 3-4);
brief description of drawings (pages 4-10);
use of scanning probe microscope tips (pages 10-12);
substrates (pages 12-13);
patterning compounds (pages 13-17);
practicing methods including, for example, coating tips (pages 18-20);
instrumentation including nanoplotters (pages 20-24);
use of multiple layers and related printing and lithographic methods (pages 24-26);
resolution (pages 26-27);
arrays and combinatorial arrays (pages 27-30);
software and calibration (pages 30-35; 68-70);
kits and other articles including tips coated with hydrophobic compounds (pages 35-37);
working examples (pages 38-67);
corresponding claims and abstract (pages 71-82); and
FIGS. 1-28.

All of the above Ser. No. 09/866,533 document text, including each of the various subsections enumerated above including the figures, is hereby incorporated by reference in its entirety and form part of the present disclosure, supporting the claims.

Other technical literature which is incorporated by reference in their entirety includes U.S. patent publications including, for example:

21. 003/0022470 ("Parallel, individually addressable probes for nanolithography");

22. 2003/0007242 ("Enhanced scanning probe microscope and nanolithographic methods using same")

23. 2003/0005755 ("Enhanced scanning probe microscope")

24. 2002/0123135 ("Nanoscale molecular arrayer")

In addition, nanolithography methods, software, hardware, instruments, and materials can be also obtained from NanoInk, Inc. (Chicago, Ill.).

The following references further describe microlithography and nanolithography with use of tips, including scanning microscopic and scanning nanoscopic tips, and are incorporated by reference in their entirety including parameters for patterning, inks, instruments, and substrates:

1. Zhang, H; Mirkin, C A: DPN-generated nanostructures made of gold, silver, and palladium *Chem. Mater.* 2004, 16 (8): 1480-1484.

2. Zhang, Y; Salaita, K; Lim, J H; Lee, K B; Mirkin, C A A massively parallel electrochemical approach to the miniaturization of organic micro- and nanostructures on surfaces *Langmuir* 2004, 20 (3): 962-968.

3. Bullen, D; Chung, S W; Wang, X; Zou, J; Mirkin, C A Parallel dip-pen nanolithography with arrays of individually addressable cantilevers *App. Phys. Lett.* 2004, 84 (5): 789-791.

4. Ginger, D. S.; Zhang, H.; Mirkin, C. A. The evolution of dip-pen nanolithography *Angew. Chem. Int. Ed.* 2004, 43 (1): 30-45.

5. Nam, J M; Han, S W; Lee, K B; Liu, X; Ratner, M A; Mirkin, C A Bioactive protein nanoarrays on nickel oxide surfaces formed by dip-pen nanolithography *Angew. Chemie. Int. Ed.* 2004, 43 (10): 1246-1249

6. Lee, K. B.; Lim, J. H.; Mirkin, C. A. Protein nanostructures formed via direct-write dip-pen nanolithography *J. Am. Chem. Soc.* 2003, 125 (19): 5588-5589.

7. Lim, J. H.; Ginger, D. S.; Lee, K. B.; Nam, J. M.; Mirkin, C. A. Direct-write dip-pen nanolithography of proteins on modified silicon oxide surfaces *Angew. Chem. Int. Ed.* 2003, 42, 2309-2312.

8. Rozhok, S.; Piner, R.; Mirkin, C. A. Dip-pen nanolithography: What controls ink transport?*J. Phys. Chem. B* 2003, 107, 751-757.

9. Zhang, H.; Chung, S. W.; Mirkin, C. A. Fabrication of sub-50-nm solid-state nanostructures on the basis of dip-pen nanolithography *Nano Letters* 2003, 3 (1): 43-45.

10. Zou, J.; Bullen, D.; Wang, X.; Liu, C.; Mirkin, C. A. Conductivity-based contact sensing for probe arrays in dip-pen nanolithography *Applied Physics Letters* 2003, 83 (3): 581-583.

Lithographic parameters including humidity, substrate preparation, tip coating, ink preparation, tip-substrate contact times, AFM printing modes (e.g., contact, non-contact, intermittent-contact), force, scan speed, and the like can be varied by one skilled in the art to provide reproducible, maximum results for a particular application.

A variety of substrates can be patterned including metallic, semiconducting, including silicon, hydrophobic, hydrophilic, polymeric, crystalline, amorphous, glassy, and ceramic surfaces. Smooth surfaces are preferred.

The tips can be modified if desired to improve deposition. Polymeric tips can be used for example including hydrophobic and hydrophilic tips. Siloxane tips can be used including alkyl siloxane polymer tips such as polydimethylsiloxane.

The invention provides for use of polymerizable compounds, polymerization catalysts, and polymerizing monomers. In a preferred embodiment, ring-opening polymerization and metathesis polymerization are carried out, and these methods are known in the art. In addition, a variety of scientific papers from the Robert Grubbs' group, as well as U.S. patents, describe metathesis polymerization, including catalysts, monomers, polymers, polymerization processes, synthetic methods, and polymer uses, including for example the following U.S. Pat. Nos. to Grubbs et al.: 4,607,112; 4,645,814; 4,690,992; 4,883,851; 4,945,135; 4,945,141; 4,945,144; 5,026,783; 5,312,940; 5,342,909; 5,710,298; 5,728,785; 5,728,917; 5,750,815; 5,811,515; 5,831,108; 5,849,851; 5,880,231; 5,916,983; 5,917,071; 5,922,863; 5,939,504; 5,969,170; 5,977,393; 6,020,443; 6,048,993; 6,080,826; 6,107,420; 6,111,121; 6,153,714; 6,153,778; 6,203,923; 6,211,391; 6,215,019; 6,284,852; 6,306,988; 6,310,121; 6,313,332; 6,376,690; 6,383,319; 6,410,666; 6,414,097; 6,426,419; 6,433,101; 6,465,590; 6,482,908; 6,486,279; 6,504,041; 6,506,860; and 6,515,084, each of which are hereby incorporated by reference in their entirety.

In the present invention, microstructures and nanostructures can be made. For example, nanostructures can be made which have a lateral feature which is about 1 micron or less, about 500 nm or less, or about 100 nm or less. Lateral features are in the plane of a substrate, not the height extending perpendicular to the substrate, and can be, for example, diameters for dots and widths for lines. The plurality of nanostructures can be separated from each other by an average edge-to-edge distance of about a micron or less, about 500 nm or less, or about 100 m or less. If dots are formed, the centers of the dots can be separated from each other by an average distance of about a micron or less, about 500 nm or less, or about 100 nm or less. If lines are formed, the centers of the lines (line drawn in the middle of the line) can be separated from each other by an average distance of about a micron or less, about 500 nm or less, or about 100 nm or less.

A variety of polymer types can be prepared. For example, inorganic and organic synthetic polymers can be prepared by these methods using, respectively, inorganic and organic monomers and polymerizable compounds. Polymers and the monomers from which they are made can be hydrophilic, hydrophobic, or amphiphilic. They can be crosslinked or uncrosslinked, lightly crosslinked or heavily crosslinked. The polymerization mechanism is not particularly limited and chain polymerization, free-radical polymerization, condensation polymerization, and ring-opening polymerization can be carried out. Linear, short chain branched, long chain branched, a comb structures can be prepared. Polymers can be dendrimers or highly branched polymers. Crystalline, semi-crystalline, and amorphous polymers can be prepared. Polymer blends can be prepared. Single layer structures can be made, or alternatively multi-layer structures can be built up. Polymers can be mixed with particulate materials including nanoparticles, quantum dots, and nanocrystals. Polymer brushes can be prepared by ATRP (atom transfer radical polymerization) as describe in, for example, K. Matyjaszewski, *Chem. Rev.,* 2001, 101, 2921-90. See also, U.S. Patent Publication 2004/0110893 published Jun. 10, 2004 to Matyjaszewski et al. Polymers can be carbon chain polymers, or can also include heteroatoms in the chain such as oxygen or nitrogen. The molecular weights of the polymers are not particularly limited but can be, for example, 10,000 to 1,000,000 weight average molecular weight. The monodispersity and polydispersity of the polymer is not particularly limited.

In addition, these methods can be used to prepare biological macromolecules by polymerization of biological monomers and biological oligomers. In this embodiment, the patterning compound is biological and reacts to form biological macromolecules upon transport from the tip to the substrate surface. A predetermined sequence, such as an amino acid or nucleic acid sequence, can be used to control the transport method and generate a preconceived biological macromolecule.

For example, proteins and peptides can be formed by polymerization of amino acids, and derivatives thereof, including alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. Proteins can be fibrous or globular. Chain length can be varied to provide polypeptides or proteins as desired.

Nucleic acids, including DNA and RNA, can be formed by polymerization of bases, and derivatives thereof, including adenine, guanine, cytosine, thymine, and uracil. Monomers can be used comprising phosphate and sugar backbone structures and organic base side groups. Both ribose and deoxyribose structures can be used. Oligonucleotides can be used.

Polysaccharides can be also prepared. These include cyclolinear polyethers formed by condensation reactions of sugars. Examples include cellulose, starch, and glycogen.

DNA and genetic macromolecular formation is described in, for example, *A Primer of Genome Science*, G. Gibson, S. Muse, Sinauer Associates, 2002; and *Understanding DNA, The Molecule and How it Works,* $2^{nd}$ Ed., C. R. Calladine and H. R. Drew, Academic Press, 1997. Biological polymers and macromolecules are described in, for example, *Contemporary Polymer Chemistry*, H. R. Allcock, F. W. Lampe, Prentice Hall, 1981, including Chapter 8 (Biological Polymers and their Reactions)

Additional nucleic acid and protein structures are described above in references 16 and 17 regarding DPN printing. PNA structures can be formed.

In general, the biological macromolecules form by condensation polymerization. The polymerization process, however, can be an addition polymerization, a coordination polymerization, a ring-opening polymerization, or any other known type of polymerization process. Block copolymers, random copolymers, segmented copolymers, and other types of mixed polymer structures can be prepared.

Persons skilled in the art can use protecting or blocking groups to practice the invention. General methods for synthesizing peptide and nucleic acid structures are known in the art and can be combined with the direct-write nanolithographic methods disclosed herein.

Photosynthetic methods can be used, as used for example by Affymetrix and others to prepare arrays of biological macromolecules, oligonucleotides, and polymeric structures.

In one embodiment, as illustrated in for example U.S. Pat. Nos. 6,406,844; 6,566,495; and 6,420,169 to Affymetrix (hereby incorporated by references in their entireties), linker molecules can be provided on a substrate. A terminal end of the linker molecules can be provided with a reactive functional group protected with a photoremovable protective group. Using lithographic methods, the photoremovable protecting group can be exposed to light and removed from the linker molecules in the first selected regions. The substrate can be then washed or otherwise contacted with a first monomer that reacts with exposed functional groups on the linker molecules. In a preferred embodiment, the monomer is an amino acid containing a photoremovable protecting group at its amino or carboxy terminus and the linker molecule terminates in an amino or carboxy acid group bearing a photoremovable protective group. A second set of selected regions can be, thereafter, exposed to light and the photoremovable protecting group on the linker molecule/protected amino acid can be removed at the second set of regions. The substrate can be then contacted with a second monomer containing a photoremovable protecting group for reaction with exposed functional groups. This process can be repeated to selectively apply monomers until polymers of a desired length and desired chemical sequence are obtained. Photolabile groups can be then optionally removed and the sequence can be, thereafter, optionally capped. Side chain protective groups, if present, can be also removed. By using lithographic techniques, it is possible to direct light to relatively small and precisely known locations on the substrate. It is, therefore, possible to synthesize polymers of a known chemical sequence at known locations on the substrate.

The resulting patterned substrate will have a variety of uses including, for example, screening large numbers of polymers for biological activity. To screen for biological activity, the substrate is exposed to one or more receptors such as an antibody, whole cells, receptors on vesicles, lipids, or any one of a variety of other receptors. The receptors are preferably labeled with, for example, a fluorescent marker, radioactive marker, or a labeled antibody reactive with the receptor. The location of the marker on the substrate is detected with, for example, photon detection or autoradiographic techniques. Through knowledge of the sequence of the material at the location where binding is detected, it is possible to quickly determine which sequence binds with the receptor and, therefore, the technique can be used to screen large numbers of peptides. Other possible applications of the inventions herein include diagnostics in which various antibodies for particular receptors would be placed on a substrate and, for example, blood sera would be screened for immune deficiencies. Still further applications for the present invention include, for example, preparation of biological microarrays and nanoarrays including protein and nucleic acid-based arrays; screening, adsorption, repairing structures such as, for example, photomask repair, study of wetting and adhesive properties, preparation of combinatorial arrays, preparation of polymer brush arrays and uses of polymer brush arrays, catalysis, diodes, identify better resists, and the like. Polymer brush arrays can be used, for example, in microelectronic circuitry, semiconductor processing, sensors and biosensors, and high density assay plates. The polymer brushes can be hydrogels, and the present invention can be used in hydrogel applications.

Polymer brushes including patterned polymer brushes are described in, for example, U.S. Pat. Nos. 6,692,914 to Klaerner et al.; patent publications 2003/0108879 published Jun. 12, 2003 to Klaerner et al.; 2002/0001845 published Jan. 3, 2002 to Klaerner et al.; 6,423,465 to Hawkes et al; and 6,413,587 to Hawkes et al.,; and 2002/00771943 published Jun. 13, 2002 to Hawkes et al.; which are hereby incorporated by reference in their entirety.

Polymer brushes can be used in air bearing sliders used in magnetic recording disk drives, and single slider fabrication. See for example, US Patent Publication 2004/0043335 to Krause et al, published Mar. 4, 2004.

The working examples below describe preferred examples of the first, second, and third nanostructures, polymerizable compounds, substrates, polymerization catalysts and catalyst precursors, passivation, and polymerization conditions.

WORKING EXAMPLES

The following experiments are working examples of the present invention, but the invention is broader than these working examples.

Reaction Scheme in FIG. 5.

Two complementary routes have been developed for synthesizing arrays of the nanoscale polymer brushes based on DPN printing and ROMP. Route I is an approach based on growing polymers from a DPN-patterned template, FIG. 5. To test the viability of this route, 1-mercapto-10-(exo-5-norbornen-2-oxy)decane molecules were patterned on a gold substrate by bringing a norbornenyl thiol-coated tip in contact with the substrate. The exo isomer rather than the corresponding endo isomer was used to optimize ROMP reactivity.[8] Subsequently, the substrate was dipped into a solution of 1-decanethiol (0.005 M) in acetonitrile for 1 min to form a passivating layer on the gold surface around the norbornenyl thiol nanostructures. After being rinsed with acetonitrile and dried with compressed difluoroethane, the samples were further immersed in a dichloromethane solution of Grubbs' first generation catalyst $((PCy_3)_2Cl_2Ru=CHPh$, 0.1 M) for 20 min. The surface was then rinsed with dry dichloromethane several times to remove excess catalyst. Finally, exposure of the catalyst-initiated wafers to a solution of norbornenyl-functionalized monomers (0.05 M) for a period of about 10 min to about 240 min resulted in polymer brush arrays.

Line and dot arrays of the polymer brushes comprised of exo-5-norbornen-2-ol were constructed according to the method in FIG. 5, as shown in FIG. 1. Topographic AFM images show the height of the polymer structures and provide insight into the uniformity of the polymer growth process. For example, the average diameter of each polymer brush dot was about 78 (±4)nm and the average height was about 5 (±1)nm (FIG. 1d). It should be noted that polymer brush nanostructures with different feature sizes (many micrometer to sub-100-nm-length scale), shapes (dots, lines, and other types of geometries), and compositions can be generated by controlling the feature size and shape of the norbornenyl thiol template (by DPN printing), the polymerization reaction time (e.g., 10-240 min), and the choice of the norbornenyl-functionalized monomers.

In addition, the feature height of the polymer nanostructures can be controlled over the 1-10 nm range by adjusting the polymerization reaction time (FIG. 2). However, under these conditions the polymer growth stopped after about 240 min, possibly due to deactivation of the immobilized catalyst.[2e]

As a confirmation experiment, arrays of nanoscale polymer brush patterns of electrochemically active monomers, exo-5-norbornen-2-yl ferrocenecarboxylate (1) and exo-5-norbornen-2-yl ferroceneacetate (2) were synthesized on gold electrodes via the above-mentioned procedure. Differential pulse voltammetry (DPV) measurements on the patterns that comprise the polymerized monomer 1 show an anodic peak at 185 mV vs(FcH/FcH$^+$), which is consistent with the solution DPV measurements of the oxidation potential for the norbornenyl ferrocenyl derivative ($E_{pa}$=180 mV vs(FcH/FcH$^+$)), FIG. 3a. In contrast, DPV measurements on the diblock copolymer patterns comprising two blocks of electrochemically distinct ferrocenyl monomers 1 and 2 exhibit two anodic peaks at −50 mV and 190 mV corresponding to the sequential oxidations of the two different types of ferrocenyl moieties (FIG. 3b). Taken together, the data presented here confirm that the polymers grow from the catalyst-initiated patterns generated by DPN printing.

FIG. 6.

In an effort to evaluate the potential of generating a polymer brush array where each dot is a different compound, an alternative procedure (Route II) that involves transporting the norbornenyl monomers to catalyst-activated substrates via an AFM microcantilever was developed (FIG. 6). These types of arrays could be useful in the generation of combinatorial libraries of nanoscale polymer features. To generate a substrate suitable for catalyst activation, a silicon oxide substrate was modified with 5-(bicycloheptenyl)trichlorosilane and immersed in a dichloromethane solution of Grubbs' first-generation catalyst for 20 min. After being washed several times with dichloromethane to remove excess catalyst, the catalyst-tethered substrate was immediately used for generating polymer brushes via a monomer-coated AFM tip. Thus, a wide range of polymers with various numbers of repeating monomer units can be generated by controlling the tip-substrate contact time. Significantly, a high-density two-dimensional array of polymer brushes that comprise different norbornenyl monomer-entities in different spatially-defined regions can be generated via this approach (FIG. 6).

Figure 4A:
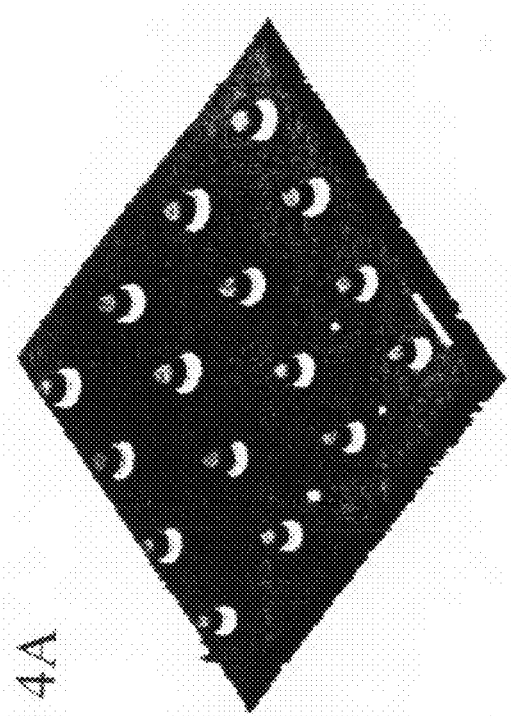
Figure 4B:
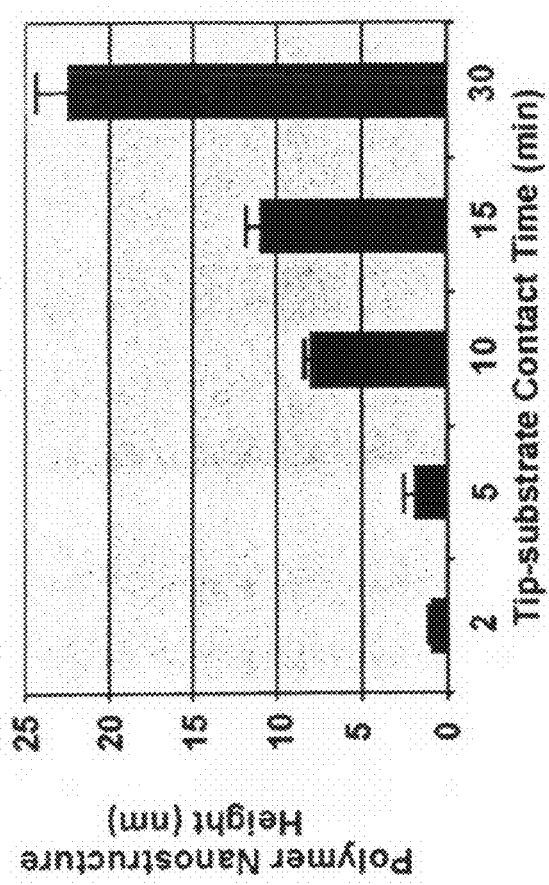

As proof-of-concept, the monomer, exo-5-norbornen-2-ol, was delivered to a catalyst-activated silicon oxide substrate via an AFM tip and polymerized in situ. In a typical patterning experiment, a conventional silicon nitride AFM microcantilever coated with a dichloromethane solution of the monomer was brought in contact with the substrate to generate an array of polymers in a glove box (N$_2$ atmosphere). An AFM topographic image of such an array comprising exo-5-norbornen-2-ol as the chain propagating monomer shows that features of controlled height (22±1 nm) can be reproducibly generated (FIG. 4a). An important feature of this monomer-DPN printing approach is the ability to monitor and control the living polymerization process on the catalyst-tethered surface with the monomer-coated microcantilever. As anticipated, the height of the polymer brush nanostructures increases with tip-substrate contact time (FIG. 4b). It is noted that the polymer growth rate in the monomer-DPN printing approach (FIG. 6) is much faster than that under comparable bulk conditions (FIG. 5). This can be attributed, in part, to the higher local concentration of the monomer accessible to the catalyst-activated sites on the patterned substrate. Indeed, the polymerizable ink is confined to the region near the tip and point of contact with the catalyst.

Experimental Section

Exo-5-norbornen-2-ol, 1-mercapto-10-(exo-5-norbornen-2-oxy)decane, exo-5-norbornen-2-yl ferrocenecarboxylate, and exo-5-norbornen-2-yl ferroceneacetate were synthesized according to literature procedures.[5b, 9] All other reagents were purchased from Aldrich Chemical Company and used without further purification. All solvents were distilled under nitrogen and saturated with nitrogen prior to use. All reactions were run under a dry nitrogen atmosphere or in a glove box unless otherwise noted. Silicon oxide wafers were cut into $0.5 \times 0.5$ cm$^2$ slides and sonicated in dichloromethane, methanol, and Nanopure™ water for 10 min, respectively. The wafers were then immersed in freshly mixed ammonia peroxide solution (NH$_3$/H$_2$O:H$_2$O$_2$:H$_2$O, v:v:v=1:1:5) for 1 hour at about 100° C., after which time they were rinsed with Nanopure™ water followed by ethanol. The gold substrates were prepared by coating a silicon oxide-coated Si wafer with a Ti adhesion layer (5 nm) followed by 50 nm of gold using an Edwards Auto 306 evaporator. DPN printing experiments were carried out in a glove box (23° C., N$_2$ atmosphere) with a Thermomicroscopes CP AFM driven by customer lithography software (NanoInk, Inc., Chicago, Ill.) and commercial Si$_3$N$_4$ cantilevers (ThermoMicroscopes Sharpened Microcantilever A, force constant=0.05 N/m). To minimize piezo tube drift problems, a 90-micrometer scanner with closed loop scan control was used for all DPN experiments. AFM topography images were acquired using a Digital Instruments Multimode Nanoscope IIIa with an extender electronics module in tapping mode. Electrochemical experiments were performed with a Bioanalytical Systems (BAS) Model 100B using Au disk electrodes with a Pt wire counter electrode and a silver wire reference electrode.

The working examples demonstrate that, in its preferred embodiments, this invention provides a novel approach for synthesizing arrays of nanoscale polymer brushes, based upon a combination of DPN printing and a surface-initiated ROMP method. The approach has been demonstrated on metallic and insulating substrates. These approaches are important for many reasons. For example, they provide a route to combinatorial libraries of functional polymer nanostructures of wide chemical complexity, which can be constructed in situ. The capabilities demonstrated via these single-pen experiments can be dramatically facilitated through the use of multi-pen arrays that do not require the step-by-step changing of inks and pens during a DPN printing experiment with single pens.[3c,3i]

In addition to the references described above, the following references are further cited as footnotes above as a guide to enable one to practice the present invention. All references cited herein are not necessarily prior art and no admission is made that they are prior art by citing to them. The references are hereby incorporated by reference in their entirety.

While the invention has been described with use of a variety of embodiments, the invention is not limited by these embodiments, and one skilled in the art can practice the invention with use of other embodiments within the skill of the art not expressly described herein.

REFERENCES

[1] a) J. M. J. Frechet, E. Eichler, H. Ito, C. G. Willson, Polymer 1983, 24, 995;
b) O. Prucker, J. Rühe, Macromolecules 1998, 31, 592;
c) S. L. Clark, P. T. Hammond, Adv. Mater. 1998, 10, 1515;
d) Y. Xu, J. T. Watson, M. L. Bruening, Anal. Chem. 2003, 75, 185;
e) A. Pogantsch, G. Trattnig, G. Langer, W. Kern, U. Scherf, H. Tillmann, H.-H. Hörhold, E. Zojer, Adv. Mater. 2002, 14, 1722;
f) C.-H. Jang, B. D. Stevens, P. R. Carlier, M. A. Calter, W. A. Ducker, J. Am. Chem. Soc. 2002, 124, 12114.

[2] a) W. M. Lackowski, P. Ghosh, R. M. Crooks, J. Am. Chem. Soc. 1999, 121, 1419;
b) T. A. von Werne, D. S. Germack, E. C. Hagberg, V. V. Sheares, C. J. Hawker, K. R. Carter, J. Am. Chem. Soc. 2003, 125, 3831;
c) B. Rowan, M. A. Wheeler, R. M. Crooks, Langmuir 2002, 18, 9914;
d) B. Domercq, R. D. Hreha, Y.-D. Zhang, N. Larribeau, J. N. Haddock, C. Schultz, S. R. Marder, B. Kippelen, Chem. Mater. 2003, 15, 1491;
e) N. Y. Kim, N. L. Jeon, I. S. Choi, S. Takami, Y. Harada, K. R. Finnie, G. S. Girolami, R. G. Nuzzo, G. M. Whitesides, P. E. Laibinis, Macromolecules 2000, 33, 2793;
f) M. Husemann, D. Mecerreyes, C. J. Hawker, J. L. Hedrick, R. Shah, N. L. Abbott, Angew. Chem. 1999, 111, 685; Angew. Chem. Int. Ed. 1999, 38, 647;
g) M. Weck, J. J. Jackiw, R. R. Ross, P. S. Weiss, R. H. Grubbs, J. Am. Chem. Soc. 1999, 121, 4088;
h) U. Schmelmer, R. Jordan, W. Geyer, W. Eck, A. Golzhauser, M. Grunze, A. Ulman, Angew. Chem. 2003, 115, 577; Angew. Chem. Int. Ed. 2003, 42, 559;
i) D. M. Jones, W. T. S. Huck, Adv. Mater. 2001, 13, 1256.

[3] For selected recent examples, see:
a) H. Zhang, S.-w. Chung, C. A. Mirkin, Nano Lett. 2003, 3, 43;
b) L. M. Demers, D. S. Ginger, S.-J. Park, Z. Li, S.-W. Chung, C. A. Mirkin, Science 2002, 296, 5574;
c) M. Zhang, D. Bullen, S.-W. Chung, S. Hong, K. S. Ryu, Z. Fan, C. A. Mirkin, C. Liu, Nanotech. 2002, 13, 212;
d) Y. Li, B. W. Maynor, J. Liu, J. Am. Chem. Soc. 2001, 123, 2105;
e) B. W. Maynor, Y. Li, J. Liu, Langmuir 2001, 17, 2575;
f) A. Noy, A. E. Miller, J. E. Klare, B. L. Weeks, B. W. Woods, J. J. DeYoreo, Nano Lett. 2002, 2, 109;
g) R. McKendry, W. T. S. Huck, B. Weeks, M. Fiorini, C. Abell, T. Rayment, Nano Lett. 2002, 2, 713;
h) L. A.; Jr. Porter, H. C. Choi, J. M. Schmeltzer, A. E. Ribbe, L. C. C. Elliott, J. M. Buriak, Nano Lett. 2002, 2, 1369;
i) P. E. Sheehan, L. J. Whitman, Phys. Rev. Lett. 2002, 88, 156104;
j) G. Agarwal, R. R. Naik, M. O, Stone, J. Am. Chem. Soc. 2003, 125, 7408;
k) P. Manandhar, J. Jang, G. C. Schatz, M. A. Ratner, S. Hong, Phys. Rev. Lett. 2003, 90, 115505;

l) P. Belaubre, M. Guirardel, G. Garcia, J. B. Pourciel, v. Leberre, A. Dagkessamanskaia, E. Trévisiol, J. M. Francois, Appl. Phys. Lett. 2003, 82, 3122;

m) C. L. Cheung, J. A. Camarero, B. W. Woods, T. Lin, J. E. Johnson, J. J. DeYoreo, J. Am. Chem. Soc. 2003, 125, 6848.

[4] Ring Opening Metathesis Polymerisation and Related Chemistry, NATO Science Series, Vol. 56 (Eds.: E. Khosravi, T. Szymanska-Buzar), Kluwer Academic Publishers, Dordrecht, 2002.

[5] a) A. G. M. Barrett, B. T. Hopkins, J. Köbberling, Chem. Rev. 2002, 102, 3301;

b) K. J. Watson, J. Zhu, S. T. Nguyen, C. A. Mirkin, J. Am. Chem. Soc. 1999, 121, 462; c) M. R. Buchmeiser, G. Seeber, M. Mupa, G. K. Bonn, Chem. Mater. 1999, 11, 1533.

[6] T. M. Trnka, R. H. Grubbs, Acc. Chem. Res. 2001, 34,18.

[7] For other examples of SPM-based lithography, see a) I. W. Lyo, P. Avouris, Science 1991, 253, 173;

b) W. T. Muller, D. L. Klein, T. Lee, J. Clarke, P. L. Mceuen, P. G. Schultz, Science 1995, 268, 1995;

c) S. L. Brandow, W. J. Dressick, C. S. Dulcey, T. S. Koloski, L. M. Shirey, J. Schmidt, J. M. Calvert, J. Vac. Sci. Technol. B 1997, 15, 1818;

d) S. S. Wong, E. Joselevich, A. T. Woolley, C. L. Cheung, C. M. Lieber, Nature 1998, 394, 52;

e) R. Maoz, E. Frydman, S. R. Cohen, J. Sagiv, Adv. Mater. 2000, 12, 424;

f) H, Sugimura, N. Nakagiri, J. Vac. Sci. Technol. B 1996, 14, 1223;

g) G.-Y. Liu, S. Xu, Y. L. Qian, Acc. Chem. Res. 2000, 33, 457;

h) C.-H. Jang, B. D. Stevens, P. R. Carlier, M. A. Calter, W. A. Ducker, J. Am. Chem. Soc. 2002, 124, 12114.

i) A. Bruckbauer et al., J. Am. Chem. Soc., 2002, 124, 8810.

[8] J. D. Rule, J. S. Moore, Macromolecules 2002, 35, 7878.

[9] G. H. Posner, J. S. Ting, C. M. Lentz, Tetrahedron 1976, 32, 2281.

What is claimed is:

1. A method of direct-write nanolithography comprising:
   a) providing a substrate surface comprising polymerization catalyst bound to the substrate surface;
   b) providing a nanoscopic tip coated with at least one monomer; and
   c) contacting the substrate surface with the nanoscopic tip to pattern the monomer on the substrate surface, wherein the polymerization catalyst induces polymerization of the monomer upon patterning to a nanostructure having a lateral feature of one micron or less.

2. The method according to claim 1, wherein the polymerization is a ring-opening metathesis polymerization.

3. The method according to claim 1, wherein the patterning is carried out with a plurality of monomers.

4. The method according to claim 1, wherein the patterning provides combinatorial polymer brush arrays.

5. The method according to claim 1, wherein the patterning provides polymer nanostructures having an average height of about 50 nm or less.

6. The method according to claim 1, wherein the patterning provides polymer nanostructures having an average height of about 25 nm or less.

7. The method according to claim 1, wherein the tip is a scanning probe microscope tip.

8. The method according to claim 1, wherein the tip is a hollow tip.

9. The method according to claim 1, wherein the patterning provides a plurality of nanostructures which are separated from each other by an average edge-to-edge distance of about a micron or less.

10. The method according to claim 1, wherein the patterning provides a plurality of nanostructures which are separated from each other by an average edge-to-edge distance of about 100 nm or less.

11. The method according to claim 1, wherein the monomer is an organic monomer.

12. The method according to claim 1, wherein the monomer is an organic ethylenically unsaturated monomer.

* * * * *